United States Patent [19]

Woolf et al.

[11] Patent Number: 5,164,360

[45] Date of Patent: * Nov. 17, 1992

[54] NICKEL-BASED SUBSTRATE FOR CERAMIC SUPERCONDUCTOR

[75] Inventors: Lawrence D. Woolf, Carlsbad; Frederick H. Elsner, Cardiff; William A. Raggio, Del Mar, all of Calif.

[73] Assignee: General Atomics, San Diego, Calif.

[ * ] Notice: The portion of the term of this patent subsequent to Apr. 9, 2008 has been disclaimed.

[21] Appl. No.: 528,683

[22] Filed: May 24, 1990

Related U.S. Application Data

[63] Continuation-in-part of Ser. No. 339,013, Apr. 14, 1989, Pat. No. 5,006,507.

[51] Int. Cl.⁵ ............................................. B32B 9/00
[52] U.S. Cl. ........................................ 505/1; 505/701; 505/702; 505/703; 505/704; 428/411.1; 428/457; 428/688; 428/704; 428/34.1; 428/901; 428/930
[58] Field of Search ................. 505/1, 701–704; 428/411.1, 457, 688, 704, 901, 930, 34.1

[56] References Cited

U.S. PATENT DOCUMENTS 4,810,339 3/1989 Hearns et al. .................. 204/180.1

OTHER PUBLICATIONS

Radio Frequency Surface Geintance of Tl-Ba-Ca-Cu-O Films on Metal and Single Crystal Substrates, Arndt et al., 1990.
Advanced Ceramic Materials, Thermal Spraying Superconducting Oxide Coatings, vol. 2, 1987, pp. 401–410.
Advanced Ceramic Materials, Large Area Plasma Spray Deposited Superconducting $YBa_2Cu_3O_7$ Thick Films, vol. 2, 1987, pp. 422–429.
Appl. Phys. Lett., High $T_c$ Superconducting Films of Y-Ba-Cu Oxides Prepared by Low-Pressure Plasma Spraying.
Appl. Phys. Lett., Reaction of $Ba_2YCu_3O_{6.9}$ Films With Yttria-Stabilized Zirconia Substrates, vol. 53, Aug. 1988, pp. 710–712.
Appl. Phys. Lett., High $T_c$ Superconductivity in Y-Ba-Cu-O Screen Printed Films, vol. 53, Sep. 1988, pp. 1110–1112.
Appl. Phys. Lett., Interdiffusion and Interfacial Reaction Between a $Ba_2Cu_3O_x$ Thin Film and Substrates, vol. 53, Oct. 1988, pp. 1437–1439.
Appl. Phys. Lett., Lanthanum Gallate Substrates for Epitaxial High-Aperture Superconducting Thin Films, vol. 53, Nov. 1988, pp. 1874–1876.
D. W. Murphy et al., Science, Processing Techniques for the 93 K Superconductor $Ba_2YCu_3O_7$, vol. 241, Aug. 1988, pp. 922–930.
Takayuki Komatsu et al., On the New Substrate Materials for High-$T_c$ Superconducting Ba-Y-Cu-O Thin Films.

*Primary Examiner*—Patrick J. Ryan
*Attorney, Agent, or Firm*—Nydegger & Associates

[57] ABSTRACT

A ceramic superconductor comprises a substantially nonmagnetic preannealed nickel-based alloy substrate which supports a ceramic superconductor. The substrate may include aluminum to strengthen the substrate, make it less magnetic and enhance its chemical compatibility with the ceramic superconductor. The ceramic is formed on the substrate by sintering superconductor grains at temperatures above 1000° C. to enhance densification of the ceramic.

26 Claims, 1 Drawing Sheet

NICKEL-BASED SUBSTRATE FOR CERAMIC SUPERCONDUCTOR

FIELD OF THE INVENTION

This application is a continuation-in-part of co-pending application Ser. No. 339,013 filed Apr. 14, 1989 now U.S. Pat. No. 5,006,507.

This invention relates to superconductors. More particularly, the present invention relates to ceramic superconductors which are supported on a chemically compatible, substantially nonmagnetic substrate. The present invention is particularly, but not exclusively, useful in applications such as magnet windings for a superconducting magnet.

BACKGROUND OF THE INVENTION

As is well known in the pertinent art, superconductors can be relatively easily manufactured as a ceramic for use in several applications. However, since a small diameter superconductor lacks sufficient inherent strength to be handled easily, it must be supported by a substrate during its use. Furthermore, a substrate is needed during the manufacture of the ceramic superconductor to provide a base on which the unsintered grains of superconductor material can be coated. Unfortunately, the extreme changes between manufacturing temperatures and operational temperatures affect both the chemical and the physical interaction between the substrate and the ceramic. As used here, chemical compatibility means an essentially inert relationship wherein there is little, if any, interdiffusion between the ceramic superconductor and the substrate. With this definition, chemical compatibility between the substrate and the superconductor is important for at least two reasons. First, the diffusion of substrate constituents into the superconductor material will dope the superconductor with foreign elements which invariably poison the superconductor. The result is a superconductor which has a lower critical temperature ($T_c$) and also a reduced critical current density ($J_c$) Second, the diffusion of superconductor material from the superconductor into the substrate may change the desirable characteristics of the substrate, e.g. embrittle the substrate. Thus, interdiffusion should be prevented, or at least minimized. One solution is to select substrate materials having minority constituents which form oxide shells such as those disclosed in co-pending patent application Ser. No. 265,827 for an invention entitled "Substrate for Ceramic Superconductor" and our co-pending application for an invention entitled "Substrate for Ceramic Superconductor with Improved Barrier," both of which are assigned to the same assignee as the present invention. Another solution is to select a substrate material which is inherently chemically compatible with the superconductor material. With this characteristic in mind, it has been determined that one such material is nickel (Ni) Pure nickel (Ni), however, is more magnetic at the cryogenic operating temperatures of superconductor materials than is desirable for some contemplated applications. Further, nickel (Ni) is more magnetic than desirable at the room temperature conditions which may be used for magnetic grain alignment fabrication of the ceramic superconductor, as disclosed in our copending U.S. patent application Ser. No. 289,968, assigned to the same assignee as the present invention.

Physical compatibility between the substrate and the superconductor is also important. Specifically, the substrate must be able to support the superconductor ceramic without putting undue stresses on the ceramic. This requires consideration of the respective coefficients of thermal expansion of the substrate and the superconductor, as well as the stability of the substrate. Moreover, these considerations apply over a very wide temperature range and a variety of operating configurations. Insofar as the respective coefficients of thermal expansion are concerned, it is preferable that the ceramic be placed in compression when the combination of substrate and ceramic superconductor is cooled.

The magnetic properties of the substrate are also of great importance. Particularly, there is a need for a nonmagnetic or weakly magnetic substrate when the superconductor is to be used as a magnet winding. Otherwise, the magnetic field generated by the magnet windings can be distorted. Also, there is a need for a nonmagnetic substrate if the substrate is to be coated with grains of superconductor material by an electrophoresis process such as is disclosed in our co-pending patent application Ser. No. 289,968 for an invention entitled "Apparatus and Method for Manufacturing a Ceramic Superconductor Coated Metal Fiber," and which is assigned to the same assignee as the present invention. This is so in order not to perturb the grain aligning magnetic field in the vicinity of the substrate wire and thus prevent a noncircular coating.

In light of the above, it is an object of the present invention to provide a substrate for a ceramic superconductor which is inherently substantially chemically compatible with the ceramic. Another object of the present invention is to provide a ceramic superconductor substrate which can support the ceramic without placing undue stresses on it. Yet another object of the present invention is to provide a ceramic superconductor substrate which is substantially more chemically compatible with the superconductor than is pure nickel. Still another object of the present invention is to provide a substantially nonmagnetic ceramic superconductor substrate. Yet another object of the present invention is to provide a superconductor that is relatively easy to manufacture and comparatively cost effective.

SUMMARY OF THE INVENTION

The preferred embodiment of the novel ceramic superconductor of the present invention comprises a metallic substrate which is chemically compatible with the particular superconductor material being used. This compatibility, i.e. minimal interdiffusion between substrate and superconductor layer, exists throughout the range of temperatures to which the substrate-superconductor combination must be exposed in order to form a ceramic superconductor coating with desirable properties.

Preferably, the substrate is a substantially nonmagnetic annealed nickel-based alloy which is identified as $Ni_{1-x}Al_x$, where $0 \leq x \leq 0.25$ or, alternatively, as $Ni_xAl_yCu_z$, where $0.6 \leq x$, $0 \leq y \leq 0.25$, and $0 \leq z \leq 0.15$. Where the aluminum content of a NiAl alloy is greater than approximately ten atomic percent (10%), it is desirable to add some boron (B) to the alloy in order to increase the ductility of the substrate. Accordingly, in such cases, the substrate is preferably $Ni_xAl_yB_z$, where $0.75 \leq x$, $0 < Y \leq 0.25$, and $0 < Z \leq 0.002$. It may be desirable to precoat the substrate with an extremely thin oxide layer, such as yttrium oxide, in order to further inhibit the already slight interdiffusion of material between substrate and superconductor layer.

The substrate can have any of several configurations. For example, and to name but a few, the substrate may be a wire, a plate, a ribbon, or a tube. The ceramic superconductor layer is preferably made from grains of the so-called 1-2-3 superconductor $REBa_2Cu_3O_7$, where $RE = Y$ or some other rare earth element. Also it is preferable that the superconductor be sintered in place on the substrate at temperatures in the range of 970° C. to 1030° C. for one (1) to fifteen (15) minutes.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
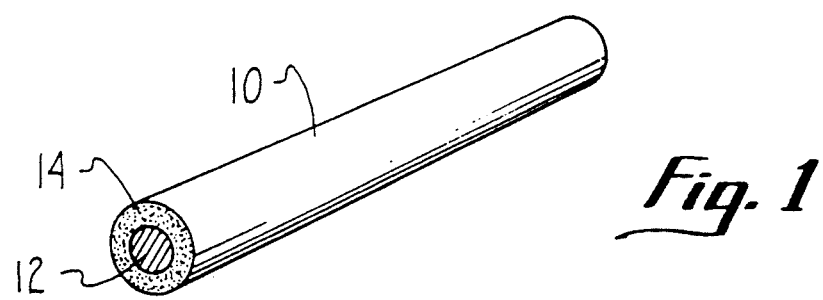
FIG. 1 is a perspective view of a wire superconductor with a portion shown in cross section.

Referring initially to FIG. 1, it will be seen that a wire superconductor 10 comprises a substrate 12 which supports a ceramic superconductor layer 14. Preferably, the ceramic superconductor layer 14 is a composition familiarly referred to as a 1-2-3 superconductor from the group identified as $RE\ Ba_2Cu_3O_{7-x}$ (where x is in the range 0-1.0). For the present invention, substrate 12 is a nickel based alloy which includes aluminum that is added to give strength to the substrate 12 and make it less magnetic, and increase its chemical compatibility with the superconductor coating.

Suitable compositions for substrate 12 include $Ni_{1-x}Al_x$ (where $0 < x \leq 0.25$); $Ni_xAl_yB_z$ (where $0.75 \leq x$, $0 < y \leq 0.25$, and $0 < z \leq 0.002$) and $Ni_xAl_yCu_z$ (where $0.6 \leq x$, $0 < y \leq 0.25$, and $0 < z \leq 0.15$). In the particular instance for $Ni_{1-x}Al_x$ when $x \geq 0.1$ (i.e., $x \geq 10$ atomic per cent), it is preferable that a minor constituent such as boron (B) be added to improve the ductility of the substrate during fabrication of the substrate. For example, substrate 12 may be composed of a material having constituents which are represented by the formula $Ni_{86.6}Al_{13.9}B_{.1}$. Such boronated compounds in which the atomic per cent of aluminum exceeds 10% tend to exhibit relatively more favorable chemical compatibility characteristics with the 1-2-3 superconductor than would otherwise be obtained with nickel alone. The $Ni_{1-x}Al_x$ material wherein x is approximately 0.1, is, however, preferred because its thermal expansion is closely matched to that of the superconductor, thereby causing relatively less cracking of the 1-2-3 superconductor during manufacture. It happens that a modification of this preferred $Ni_{90}Al_{10}$ material is commercially available and is sold as DURANICKEL Alloy 301 by Huntington Alloys. Importantly, it has been found that $Ni_{90}Al_{10}$ is chemically compatible with the 1-2-3 superconductor material used for wire superconductor 10. For all suitable substrate materials, it is to be appreciated that some minor constituents may be added if desired. For example, DURANICKEL Alloy 301 includes some minor constituents. In general, some suitable minor constituents could be silicon (Si), titanium (Ti), manganese (Mn), boron (B) and beryllium (Be). These minor constituents may also make the Ni-Al alloy even less magnetic. Typical amounts of minority constituents which might be useful for this purpose could be on the order of one quarter to five (0.25–5) weight percent of the alloy.

In addition to its chemical compatibility with 1-2-3 superconductors, $Ni_{90}Al_{10}$ and DURANICKEL 301 have other favorable characteristics. For one thing, they are considerably less magnetic than pure nickel. Also, for certain situations, such as when the substrates are to be coated using magnetic field electrophoresis, the substrate wires can be made even less magnetic by heating them above their Curie temperatures of approximately 50° F. to 150° F. Further, their thermal expansion characteristics compare favorably with those of the superconductor layer 14 throughout the temperature range to which the combination will be subjected. Very importantly, however, in order to ensure the stability of the substrate 12 throughout these temperature excursions, the substrate 12 must be in the annealed condition before being coated with ceramic superconductor, i.e. preannealed. Specifically, it has been found that when using an unannealed nickel wire for substrate 12, which is slightly curved when it is removed from its spool, the substrate 12 will anneal, and thus straighten out at temperatures below or near those required for properly sintering the superconductor ceramic. Consequently, the superconductor layer 14 is invariably stressed to a point where it will crack. On the other hand, with a preannealed material this problem is obviated.

The $Ni_xAl_yCu_z$ and $Ni_xAl_yB_z$ materials exhibit characteristics similar to those described above for $Ni_{1-x}Al_x$. Depending on their composition, they may even be less magnetic. Importantly, they too should be preannealed.

Figure 2:
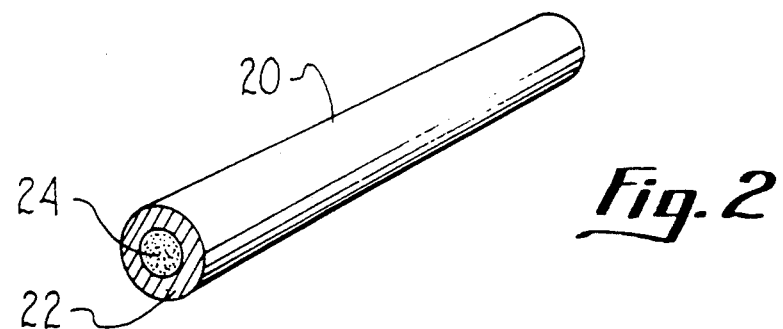
FIG. 2 is a perspective view of a tube superconductor with a portion shown in cross section.

FIG. 2 shows a tubular shaped superconductor 20 in which a tube substrate 22 has been filled with superconductor material 24. Although FIG. 2 shows a configuration wherein the lumen of tube substrate 22 is completely filled with superconductor material 24, it is to be appreciated that tube substrate 22 could have a sufficiently large diameter lumen to permit a coating of the lumen surface rather than a complete filling of the lumen.

Figure 3:
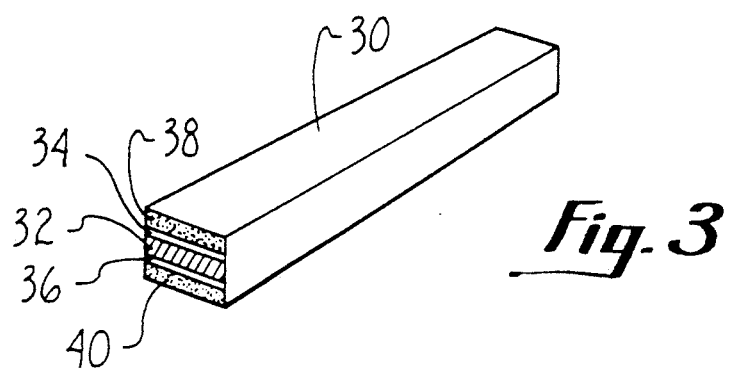
FIG. 3 is a perspective view of a precoated ribbon or plate superconductor with a portion shown in cross section.

It may also be desirable to have a thin oxide shell between the substrate and superconductor to further inhibit the probability of interdiffusion. FIG. 3 shows a flat superconductor 30 which has such a shell. Specifically, FIG. 3 shows a substantially flat or ribbon-shaped substrate 32 which has a precoat oxide shell layer 34 on one of its surfaces and a precoat oxide shell layer 36 on the opposite surface. Ceramic superconductor layers 38 and 40 are respectively supported on precoat layers 34 and 36 by the substrate 32.

It is to be appreciated that substrates 12, 22 and 32 are all preferably preannealed $Ni_{1-x}Al_x$, specifically DURANICKEL 301 is preferred, and that the superconductor layers 14, 24, 38 and 40 are all preferably a so-called 1-2-3 superconductor. Further, substrates 12, 22 and 32 can be thin and have a relatively small cross-sectional area. For example, wire substrate 12 can have a substantially circular cross section with a diameter in the range of one (1) mil to twenty (20) mils. It is particularly important with substrates 12 in this size range that the material used for the substrate be preannealed.

Although the manufacture of superconductor devices as discussed above may be with reference to a particular configuration, it is to be understood that the manufacture is substantially the same regardless of substrate configuration. For example, if it is desired to manufacture a substrate precoated with a thin oxide layer, the substrate is first coated with a substance such as yttrium alkoxide. After hydrolyzing the yttrium alkoxide to form yttrium hydroxide, the coated substrate is then fired to approximately 400° C. in an oxidizing environment and maintained at that temperature for approximately one (1) hour to form a thin layer of yttrium oxide on the substrate. Similar processes such as vapor deposition processes, well known in the art, can be followed to coat the substrate with other oxide layers such as zirconium oxide or a rare earth oxide.

Subsequently, the substrate with its precoat oxide layer is then coated with grains of superconductor material. This coating of the substrate with superconductor material can be accomplished in any of several ways, such as by the electrophoresis process disclosed in our co-pending application cited above. The superconductor grains which have been coated on the substrate are then sintered on the substrate at temperatures in the range of 970° C. to 1030° C. for a period of from one (1) to fifteen (15) minutes. At these temperatures, the ceramic achieves greater densification than can be attained at the lower, more commonly used sintering temperatures in the range of 960° C., particularly for grains without lower melting eutectic liquid phases. It will be appreciated that the precoat may not be considered necessary. In that case, a preannealed nonmagnetic nickel based substrate is simply coated with grains of superconductor material and these grains are sintered on the substrate as disclosed above. While the particular ceramic superconductor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. a ceramic superconductor which comprises:
an oxygen-containing high $T_c$ ceramic superconductor layer supported on a substrate, wherein said substrate is a nickel-aluminum-boron material identified as $Ni_xAl_yB_z$, where x is greater than or equal to three quarters ($x \geq 0.75$, y is greater than zero and less than or equal to one-quarter ($0 < y \leq 0.25$), and z is greater than zero and less than or equal to two one thousandths ($0 < z \leq 0.002$), where x, y, and z are the relative atomic percentages of Ni, Al and B, respectively.

2. A ceramic superconductor as recited in claim 1 wherein x is approximately equal to eighty six one-hundredths (0.86), y is approximately equal to one hundred thirty nine one-thousandths (0.139), and z is approximately equal to one one-thousandth (0.001).

3. A ceramic superconductor as recited in claim 1 wherein said substrate is a wire.

4. A ceramic superconductor as recited in claim 1 wherein said substrate is a flat ribbon.

5. A ceramic superconductor as recited in claim 1 wherein said substrate is a plate.

6. A ceramic superconductor as recited in claim 1 wherein said substrate is a tube.

7. A ceramic superconductor as recited in claim 1 further comprising a precoat oxide layer deposited on said substrate between said ceramic superconductor layer and said substrate.

8. A ceramic superconductor as recited in claim 7 wherein said precoat oxide layer is yttrium oxide.

9. A ceramic superconductor as recited in claim 7 wherein said precoat oxide layer is a rare earth oxide.

10. A ceramic superconductor as recited in claim 7 wherein said precoat oxide layer is zirconium oxide.

11. A ceramic superconductor as recited in claim 1 wherein said substrate is preannealed.

12. A ceramic superconductor as recited in claim 1 further comprising an aluminum oxide layer on the surface of said substrate between said substrate and said superconductor layer.

13. A ceramic superconductor as recited in claim 1 wherein said substrate is substantially nonmagnetic.

14. A ceramic superconductor which comprises:
a preanneal aluminum and boron containing nickel substrate; and
an oxygen-containing high $T_c$ ceramic superconductor layer supported on said substrate.

15. A ceramic superconductor as recited in claim 14 wherein said substrate is a nickel-aluminum-boron material identified as $Ni_xAl_yB_z$, where x is greater than or equal to three quarters ($x \leq 0.75$), y is greater than zero and less than or equal to one-quarter ($0 < Y \leq 0.25$) and z is greater than zero and less than or equal to two one thousandths ($0 < Z \leq 0.002$), where x, y, and z reresent the relative atomic percentages of Ni, Al, and B, respectively.

16. A ceramic superconductor as recited in claim 14 wherein x is approximately equal to eighty six one-hundredths (0.86), y is approximately equal to one hundred thirty nine one-thousandths (0.139), and z is approximately equal to one one-thousandth (0.001).

17. A ceramic superconductor as recited in claim 14 wherein said substrate is a wire.

18. A ceramic superconductor as recited in claim 14 wherein said substrate is a flat ribbon.

19. A ceramic superconductor as recited in claim 14 wherein said substrate is a plate.

20. A ceramic superconductor as recited in claim 14 wherein said substrate is a tube.

21. A ceramic superconductor as recited in claim 14 further comprising a precoat oxide layer deposited on said substrate between said ceramic superconductor layer and said substrate.

22. A ceramic superconductor as recited in claim 21 wherein said precoat oxide layer is yttrium oxide.

23. A ceramic superconductor as recited in claim 21 wherein said precoat oxide layer is a rare earth oxide.

24. A ceramic superconductor as recited in claim 21 wherein said precoat oxide layer is zirconium oxide.

25. A ceramic superconductor as recited in claim 14 further comprising an aluminum oxide layer on the surface of said substrate between said substrate and said superconductor layer.

26. A ceramic superconductor as recited in claim 14 wherein said substrate is substantially nonmagnetic.

* * * * *